(12) United States Patent
Anderson et al.

(10) Patent No.: US 6,725,021 B1
(45) Date of Patent: Apr. 20, 2004

(54) METHOD FOR TUNING AN ENVELOPE TRACKING AMPLIFICATION SYSTEM

(75) Inventors: Dale Anderson, Colleyville, TX (US); James E. Mitzlaff, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 112 days.

(21) Appl. No.: 10/175,666

(22) Filed: Jun. 20, 2002

(51) Int. Cl.[7] ................................. H03C 1/62
(52) U.S. Cl. .................... 455/115.1; 455/522; 455/125; 330/297
(58) Field of Search ............... 455/115.1, 91, 455/114.3, 115.2, 115.3, 572, 574, 522, 127.5, 126, 127.1, 571, 125; 330/285, 297, 136, 260

(56) References Cited

U.S. PATENT DOCUMENTS

| | | | | |
|---|---|---|---|---|
| 5,251,331 A | | 10/1993 | Schwent et al. | |
| 5,710,991 A | * | 1/1998 | Lee | 455/126 |
| 5,977,759 A | | 11/1999 | Sitch | |
| 6,043,707 A | * | 3/2000 | Budnik | 330/10 |
| 6,064,269 A | * | 5/2000 | Ruppel et al. | 330/297 |
| 6,163,706 A | * | 12/2000 | Rozenblit et al. | 455/522 |
| 6,348,781 B1 | | 2/2002 | Midya et al. | |
| 6,349,216 B1 | * | 2/2002 | Alberth et al. | 455/550.1 |
| 6,449,465 B1 | * | 9/2002 | Gailus et al. | 455/126 |

* cited by examiner

Primary Examiner—Edward F. Urban
Assistant Examiner—Sonny Trinh
(74) Attorney, Agent, or Firm—Steven A. May

(57) ABSTRACT

An optimal operating point of an envelope tracking amplification system that includes a radio frequency (RF) power amplifier having an RF amplifying element is determined based on an application to the RF power amplifier of a supply voltage that is less than the rated voltage of the RF amplifying element.

19 Claims, 5 Drawing Sheets

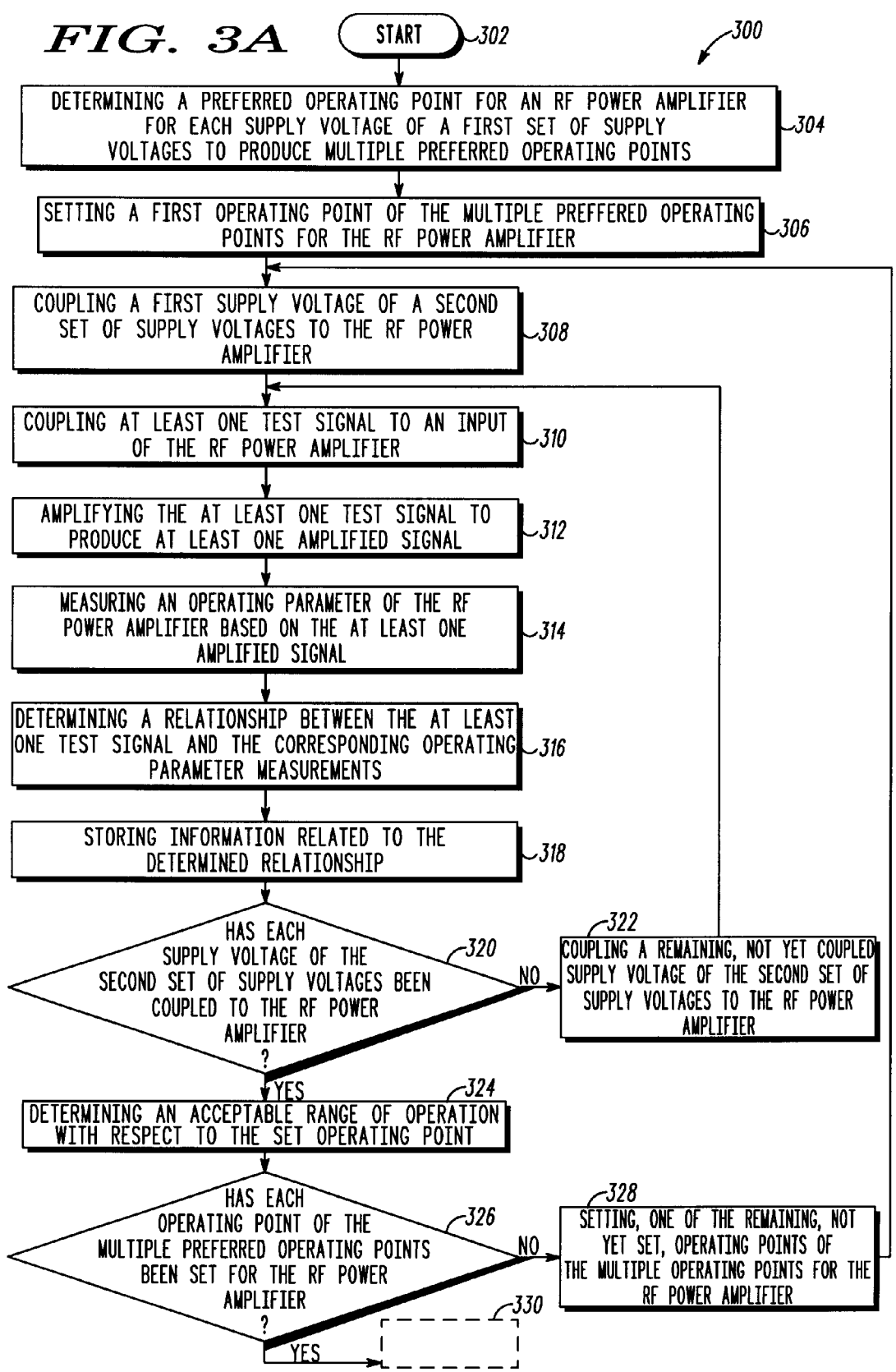

METHOD FOR TUNING AN ENVELOPE TRACKING AMPLIFICATION SYSTEM

FIELD OF THE INVENTION

The present invention relates generally to wireless communication devices and in particular to an envelope tracking amplification system of a wireless communication device.

BACKGROUND OF THE INVENTION

Power amplifiers for wireless transmission applications, such as radio frequency (RF) power amplifiers, are utilized in a wide variety of communications and other electronic applications. Ideally, the input-output transfer function of a power amplifier should be linear, that is, should implement a constant gain adjustment and phase adjustment of an input signal, wherein a perfect replica of the input signal, increased in amplitude, appears at the output of the power amplifier.

In addition, for greater efficiency, various RF systems, such as cellular systems, attempt to run power amplifiers at or near their saturation levels, in which the actual output power of the amplifier is just below its maximum rated power output level. This power output level is generally related to the supply voltage (or supply power) to the power amplifier, such that a greater supply voltage will produce a correspondingly greater output power from the amplifier; for higher power input signals, a correspondingly greater actual power output is required to maintain the amplifier at or near saturation. In various prior art amplifiers, however, the supply voltage to the power amplifier is fixed. Given a typical usage situation in which actual power output from the amplifier may vary by a range of several orders of magnitude, use of a fixed supply voltage is highly inefficient, as output power is often an order of magnitude below its maximum, and the power amplifier is not maintained at or near its saturation levels.

Various techniques have evolved to vary the supply voltage to maintain the power amplifier at or near saturation. One such technique is power supply modulation (PSM) that varies, or modulates, the supply voltage to the power amplifier in order to maintain the power amplifier at or near saturation while the input signal varies over time. For PSM, the supply voltage of the amplifier tracks the input signal variations, typically utilizing a signal detector in conjunction with a tracking power supply. In the prior art, however, the various PSM techniques have generally been limited to narrowband applications, or have poor efficiency characteristics.

For example, one prior art PSM technique, known as "envelope elimination and restoration" (EER), utilizes a limiter to provide an essentially constant drive level to the power amplifier to maintain the amplifier in a hard saturation state and increase efficiency. Use of the limiter, however, greatly expands the bandwidth of the RF signal input to the amplifier and requires very accurate tracking of the input signal envelope, with a power supply switching frequency approximately ten times greater than the bandwidth of the RF input signal. As these switching frequencies increase, the transistors within the tracking power supply become less efficient, resulting in excessive power losses. The resulting bandwidth expansion of the limiter also requires the bandwidth capability of the amplifier to be significantly greater than the input signal bandwidth, limiting the EER configuration to narrow bandwidth applications, such as amplitude modulation (AM) RF broadcasts.

Another prior art PSM technique, known as "envelope tracking," does not utilize the limiter of EER. Consequently, envelope tracking power amplification systems may be more suitable for higher bandwidth applications. Since envelope tracking power amplification systems modulate the supply voltage provided to the power amplifier, in order to maintain linearity the power amplifier of an envelope tracking power amplifier system must be capable of maintaining a constant gain across varying supply voltages. Operational constraints of the envelope tracking power amplification system are then defined by the supply voltages at which a specified level of gain can no longer be achieved.

Typically, envelope tracking amplification systems are tuned for optimal gain and intermodulation distortion (IM) only at a maximum tracking power supply voltage. The maximum tracking power supply voltage is a rated voltage, that is, a maximum drain (for a metal-oxide semiconductor field effect transistor (MOSFET)) or collector (for a bipolar junction transistor) supply voltage, of a power transistor included in the power amplifier, which power transistor amplifies an input signal coupled to the envelope tracking amplification system. However, tuning at a maximum tracking power supply voltage may yield a sub-optimal range of supply voltages across which a constant gain may be achieved, resulting in a limited range of linear operation of the envelope tracking amplification system.

Therefore, there is a need for a method for tuning an envelope tracking amplification system that results in a constant gain across a wider range of supply voltages than the current tuning methods, thereby producing an envelope tracking amplification system of improved linearity.

BRIEF DESCRIPTION

FIG. 3A is a logic flow diagram of steps performed by the test system of FIG. 2 in a tuning of the envelope tracking amplification system of FIG. 1 in accordance with an embodiment of the present invention.

DETAILED DESCRIPTION OF THE INVENTION

Figure 1:
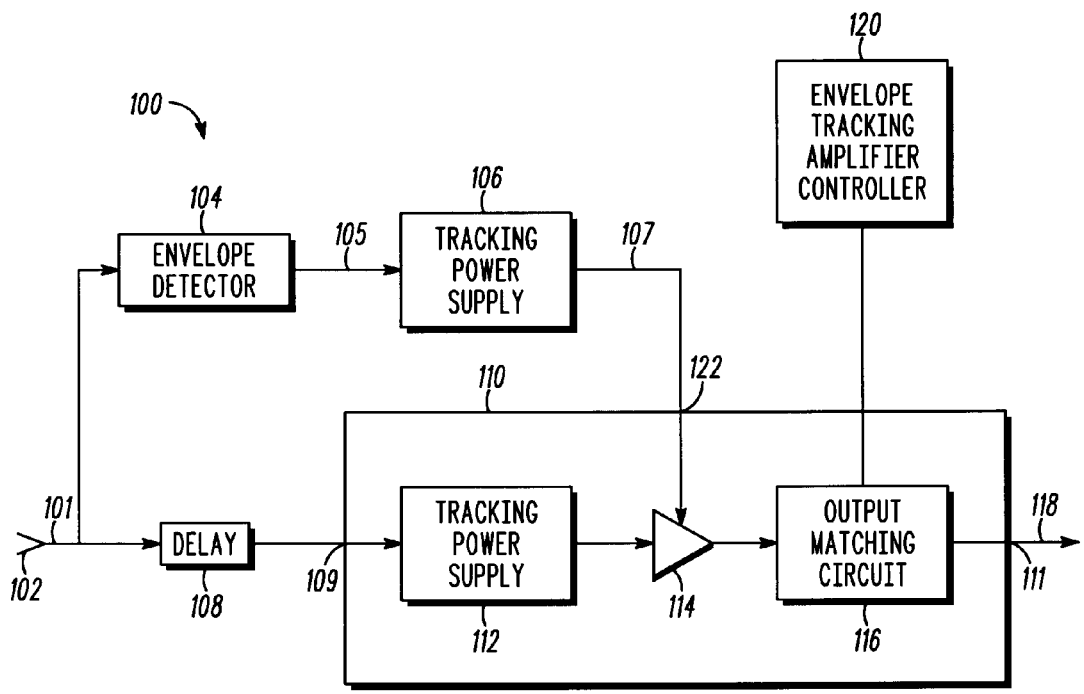
FIG. 1 is a block diagram of an envelope tracking amplification system in accordance with an embodiment of the present invention.

To address the need for a method for tuning an envelope tracking amplification system that results in a constant gain across a wider range of supply voltages than the current tuning methods, thereby producing an envelope tracking amplification system of improved linearity, an optimal operating point of an envelope tracking amplification system that includes a radio frequency (RF) power amplifier having an RF amplifying element is determined based on an application to the RF power amplifier of a supply voltage that is less than the rated voltage of the RF amplifying element.

Generally, one embodiment of the present invention encompasses a method for tuning an RF power amplifier. The method includes steps of determining a preferred operating point for the RF power amplifier for each supply voltage of a first set of supply voltages to produce multiple preferred operating points and, for each preferred operating point of the multiple preferred operating points, determining, for each supply voltage of a second set of supply voltages, a relationship between an operating parameter of the RF power amplifier and a signal coupled to an input of the RF power amplifier to produce multiple relationships associated with the preferred operating point. The method further includes steps of, for each preferred operating point of the multiple preferred operating points, determining a range of acceptable operation of the RF power amplifier based on the multiple relationships associated with the preferred operating point and comparing the range of acceptable operation determined with respect to each preferred operating point of the multiple preferred operating points to the ranges of acceptable operation determined with respect to the other preferred operating points of the multiple preferred operating points to produce at least one comparison. The method further includes a step of determining an optimal operating point based on the at least one comparison.

Another embodiment of the present invention encompasses a method for tuning an envelope tracking amplification system having a radio frequency (RF) power amplifier. The method includes steps of determining an operating point for each supply voltage of multiple supply voltages to produce multiple operating points and setting a first operating point of the multiple operating points. The method further includes steps of, in response to setting the first operating point, coupling a first supply voltage to the RF power amplifier, coupling a first input signal to an input of the RF power amplifier, amplifying the first input signal to produce a first amplified signal, and measuring an operating parameter of the RF power amplifier based on the first amplified signal to produce a first operating parameter measurement. The method further includes steps of, in response to setting the first operating point, coupling a second supply voltage to the RF power amplifier, coupling a second input signal to the input of the RF power amplifier, amplifying the second input signal to produce a second amplified signal, and measuring an operating parameter of the RF power amplifier based on the input signal and the second amplified signal to produce a second operating parameter measurement.

The method further includes steps of setting a second operating point of the multiple operating points and, in response to setting the second operating point, coupling the first supply voltage to the RF power amplifier, coupling a third input signal to the input of the RF power amplifier, amplifying the third input signal to produce a third amplified signal, and measuring an operating parameter of the RF power amplifier based on the third amplified signal to produce a third operating parameter measurement. The method further includes steps of, in response to setting the second operating point, coupling the second supply voltage to the RF power amplifier, coupling a fourth input signal to an input of the RF power amplifier, amplifying the fourth input signal to produce a fourth amplified signal, and measuring an operating parameter of the RF power amplifier based on the fourth amplified signal to produce a fourth operating parameter measurement. The method further includes a step of determining an optimal operating point based on the first operating parameter measurement, the second operating parameter measurement, the third operating parameter measurement, and the fourth operating parameter measurement.

Yet another embodiment of the present invention encompasses a method for tuning an envelope tracking amplification system that includes a RF power amplifier having an RF amplifying element. The method includes steps of coupling a predetermined supply voltage to the RF power amplifier, wherein the predetermined supply voltage is less than a rated voltage of the RF amplifying element and determining a preferred operating point for the RF power amplifier based on the predetermined supply voltage.

The present invention may be more fully described with reference to FIGS. 1–6. FIG. 1 is a block diagram of envelope tracking amplification system 100 in accordance with an embodiment of the present invention. Envelope tracking amplification system 100 includes an input 102 coupled to each of an envelope detector 104 and a radio frequency (RF) power amplifier 110. Envelope tracking amplification system 100 further includes a tracking power supply 106 coupled to the envelope detector and further coupled to RF power amplifier 110. Envelope tracking amplification system 100 may further include a delay circuit 108 interposed between input 102 and RF power amplifier 110. Delay circuit 108 is utilized to delay, and thereby synchronize, a version of input signal 101 that is applied to RF power amplifier 110 with a corresponding control signal 107 that is sourced by tracking power supply 106 to the RF power amplifier.

RF power amplifier 10 includes an RF input 109, a supply voltage input 122, and an output 111 and further includes at least one RF amplifying element 114 such as a power transistor, preferably a lateral drain metal-oxide semiconductor (LDMOS) transistor, an input matching circuit 112, an output matching circuit 116, and biasing and decoupling circuitry as are necessary to allow the functionality of the RF amplifying element and to bias the RF amplifying element class AB; however, those of ordinary skill in the art realize that other biases, such as classes A, B, or C, may be used here without departing from the spirit and scope of the present invention.

In one embodiment of the present invention, output matching circuit 116 includes an adjustable load circuit. Adjustable load circuits are well known in the art and will not be described in detail. For example, an adjustable load circuit whose load impedance may be adjusted in response to a control signal is described in detail in U.S. Pat. No. 5,060,294, entitled "Dual Mode Power Amplifier for Radiotelephone," which patent is assigned to the assignee of the present invention and is hereby incorporated by reference herein in its entirety. An envelope tracking amplification system controller 120 controls the adjustable load circuit, thereby controlling an output impedance presented to RF amplifying element 114. By adjusting an impedance of output matching circuit 116, envelope tracking amplification system controller 120 is able to effectuate a desired operating point for RF power amplifier 110. By effectuating a desired operating point for RF power amplifier 110, envelope tracking amplification system controller 120 can control the gain applied to an amplified signal and the distortion components introduced to the amplified signal by RF power amplifier 110.

In yet another embodiment of the present invention, output matching circuit 116 may include multiple, parallel load circuits and a multiple output switching device, such as a demultiplexer or multiple RF switching devices such as PIN diodes or GASFET switches, that is coupled between each load circuit of the multiple, parallel load circuits and RF amplifying element 114. The multiple output switching device is further coupled to envelope tracking amplification system controller 120, which, by controlling the multiple output switching device, controls which load circuit of the multiple load circuits is coupled to RF amplifying element 114. By selecting a load circuit from among the multiple load circuits for coupling to RF amplifying element 114, envelope tracking amplification system controller 120 is again able to control the output impedance presented to the RF amplifying element and to effectuate a desired operating point for RF power amplifier 110.

Envelope tracking amplification system 100 operates as follows. An RF signal 101 comprising carrier components is input into envelope tracking amplification system 100. Envelope tracking amplification system 100 routes input signal 101 to envelope detector 104. Envelope detector 104 tracks or detects an envelope of input signal 101 to produce an envelope detector signal 105, typically a voltage. A tracking power supply 106 is then utilized to further track (or quantize) the envelope detector voltage or signal 105 and to adjust a control signal 107 that is based on the envelope of input signal 101 and is sourced by the tracking power supply to RF power amplifier 110.

In one embodiment of the present invention, control signal 107 is a supply voltage sourced to RF power amplifier 110. By tracking input signal 101, envelope detector 104 and tracking power supply 106 provide a variable supply voltage 107 to RF power amplifier 110 and enable the main amplifier to be maintained at or near saturation over a wide range of magnitudes of input signal 101, thereby providing for highly efficient amplification of the input signal.

Typically, in the prior art, an RF power amplifier portion of an envelope tracking amplification system is tuned for optimal gain, phase shift, and/or intermodulation distortion (IM) at a rated supply voltage of a RF amplifying element included in the amplification system. For example, RF amplifying element 114 may be an MRF286 power transistor or a MRF187 power transistor, each available from Motorola, Inc., of Schaumburg, Ill. MRF286 is a 26 volt (V) part, that is, is rated for a supply voltage of 26V, and MRF187 is a 27 volt (V) part. As a result, an envelope tracking amplification system of the prior art having an RF power amplifier that includes an MRF187 power transistor is tuned by coupling a supply voltage of 27V to the envelope tracking amplification system and then effectuating a desired operating point for the amplification system based on the 27V supply voltage.

Figure 2:
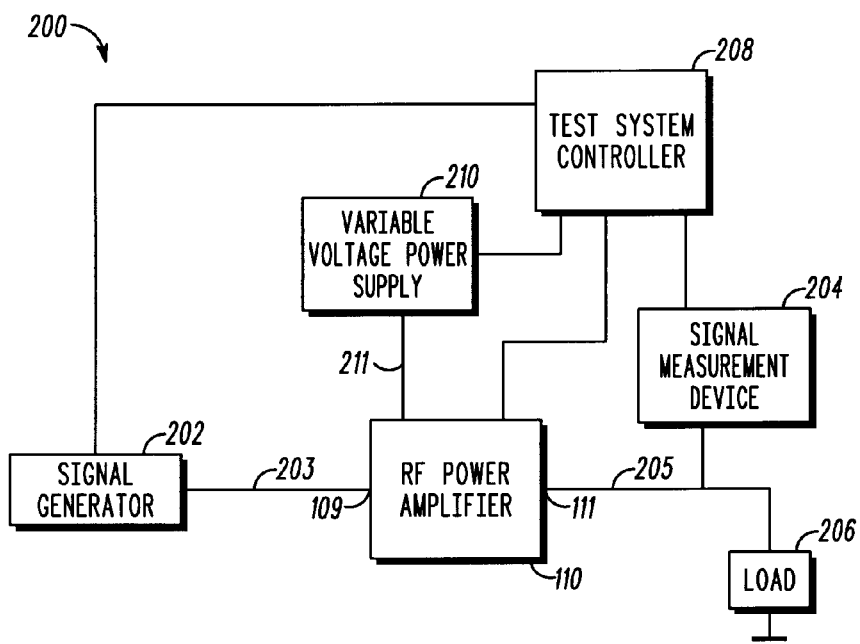
FIG. 2 is a block diagram of a test system for tuning an envelope tracking amplification system in accordance with an embodiment of the present invention.

In order to maximize an operating efficiency of envelope tracking amplification system 100 and to provide acceptable operation of the amplification system across the widest range of supply voltages during operation of the amplification system, such as providing a constant gain, that is, gain flatness, over the widest range of supply voltages, a supply voltage that is used to tune RF power amplifier 110 of envelope tracking amplification system 100 is dynamically selected during a tuning process. FIG. 2 is a block diagram of a test system 200 for a tuning of envelope tracking amplification system 100, and in particular RF power amplifier 110, in accordance with an embodiment of the present invention. Test system 200 includes a signal generator 202 that is coupled to input 109 of RF power amplifier 110 and that sources at least one test signal 203 to the RF power amplifier to produce at least one amplified signal 205. Test system 200 further includes a signal measurement device 204 that measures an operating parameter associated with the at least one amplified signal 205, and a load 206 to receive the at least one amplified signal 205.

Those who are of ordinary skill in the art realize that test system 200 can be either a physical test system or a simulated test system. For example, test system 200 may be set up in a factory or an envelope tracking amplification system design laboratory using discrete hardware components. By way of another example, test system 200 may be implemented in a computer aided design (CAD) system and may be utilized as part of a computer simulation design process for determining an optimal design of an envelope tracking amplification system, and in particular an RF power amplifier. For example, test system 200 may be utilized as part of a simulation process to determine optimal values for components of an output matching circuit of the RF power amplifier, which component values can then be implemented in a hardware version of the output matching circuit.

Test system 200 further includes a test system controller 208 that is operably coupled to, and controls, signal generator 202 and measurement device 204 and that stores their respective readings. Alternatively, the functions described herein of test system controller 208 may be performed by envelope tracking system controller 120. Test system controller 208 further may be operably coupled to RF power amplifier 110 and may control an adjustment of a load presented by output matching circuit 116 to RF amplifying element 114. Test system 200 further includes a variable voltage power supply 210 that is coupled to supply voltage input 122 of RF power amplifier 110 and is further coupled to, and controlled by, test system controller 208. Variable voltage supply 210 performs the function of tracking power supply 106 during the tuning process by sourcing a supply voltage 211 to RF power amplifier 110. Alternatively, the functions described herein of variable voltage supply 210 may be performed by tracking power supply 106.

Preferably, signal measurement device 204 is a power meter that measures a power of the at least one amplified signal 205. However, those who are of ordinary skill in the art realize that the type of measurement device comprising signal measurement device 204 depends upon the operating parameter being measured. For example, in another embodiment of the present invention, wherein the operating parameter being measured is distortion introduced to an amplified signal by amplification system 100, measurement device 204 may comprise a spectrum analyzer or a phase analyzer coupled to, or implemented in, controller 208.

Figure 3B:
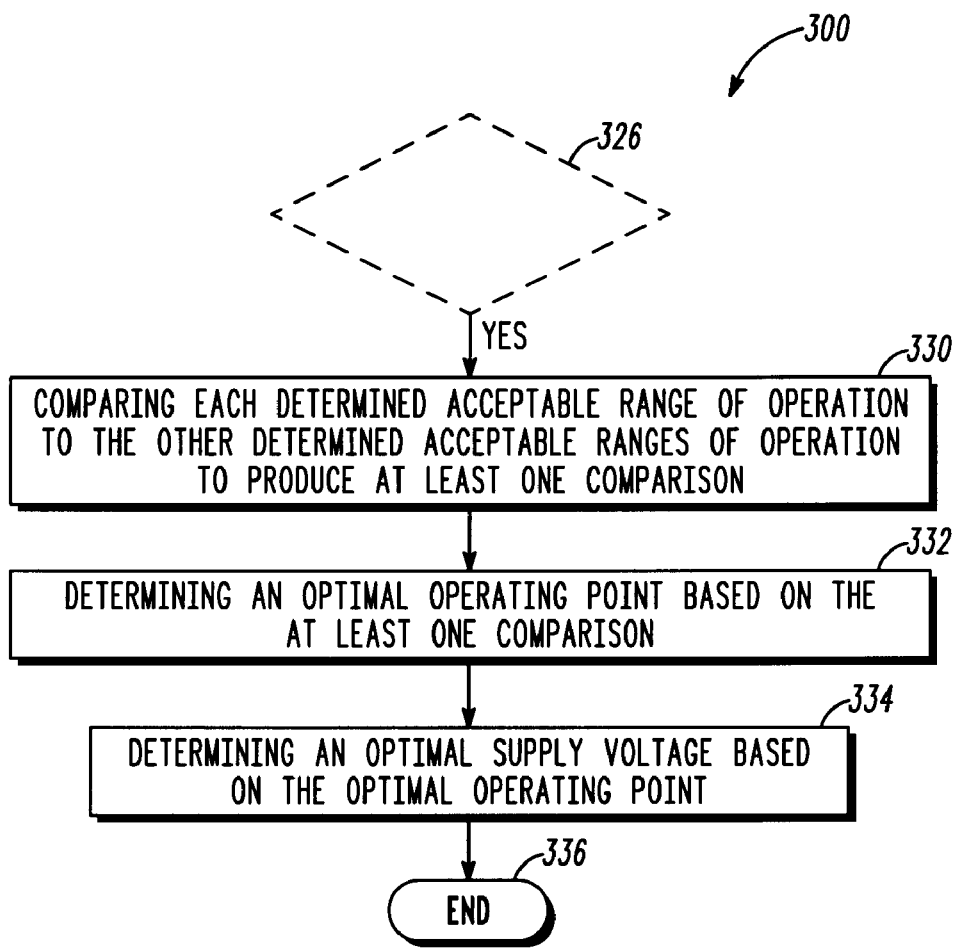
FIG. 3B is a continuation of the logic flow diagram of FIG. 3A of steps performed by the test system of FIG. 2 in a tuning of the envelope tracking amplification system of FIG. 1 in accordance with an embodiment of the present invention.

FIGS. 3A and 3B are a logic flow diagram 300 of steps performed by test system 200 in tuning RF power amplifier 110 in accordance with an embodiment of the present invention. As noted above, envelope tracking amplification system 100 is designed to operate over a range of supply voltages. Logic flow 300 begins (302) when test system 200 determines (304) a preferred operating point for envelope tracking amplification system 100 for each supply voltage of a first set of supply voltages, thereby producing multiple preferred operating points.

In one embodiment of the present invention, a preferred operating point associated with each supply voltage of the first set of supply voltages may be predetermined by the designer of RF power amplifier 110 and stored in controller 208. In another embodiment of the present invention, a determination of a preferred operating point for each supply voltage of the first set of supply voltages may include the following steps. Variable voltage power supply 210 couples a first supply voltage of the first set of supply voltages to RF amplifying element 114 of RF power amplifier 110. In addition, signal generator 202 generates at least one test signal 203 that is coupled to input 109 of RF power amplifier 110. Test system controller 208 adjusts output matching circuit 116 in order to adjust an output impedance presented to RF amplifying element 114 and thereby an operating point of RF amplifying element 114. RF amplifying element 114 amplifies the at least one test signal based on the adjusted operating point to produce at least one amplified signal. Measurement device 204 measures an operating parameter, such as gain, phase, or IM, of RF power amplifier 110 based on the at least one amplified signal and the adjusted operating point. Test system controller 208 then determines a preferred operating point associated with the first supply voltage by selecting an operating point corresponding to an optimal measured operating parameter.

Preferably, the preferred operating point is an operating point of RF amplifying element 114 that yields an optimal operating parameter. When the at least one test signal is applied to RF power amplifier 110, and via input matching circuit 112 to RF amplifying element 114, test system controller 208 adjusts an operating point of RF amplifying element 114 by adjusting the output impedance presented to the RF amplifying element. Controller 208 then determines an optimal operating point that corresponds to the optimal operating parameter as measured by measurement device 204.

A second supply voltage of the first set of supply voltages is then sourced to RF power amplifier 110 and signal generator 202 again generates at least one test signal 203 that is also coupled to the RF power amplifier. In response to the coupling of the second supply voltage and the coupling of at least one test signal 203 to RF power amplifier 110, test system controller 208 determines a preferred operating point associated with the second supply voltage. The above process continues until a preferred operating point is determined for each supply voltage of the first set of supply voltages, thereby producing multiple preferred operating points.

In one embodiment of the present invention, the at least one test signal may be set at multiple power levels, such as a swept power signal or signals, or may be set at a single power level, such as a lower end, a mid-range, or an upper end of a specified input signal power range of RF power amplifier 110. Test system controller 208 then optimizes an operating parameter of RF power amplifier 110 by adjusting output matching circuit 116 of the RF power amplifier in response to receipt of the test signal. In another embodiment of the present invention, the at least one test signal may comprise multiple test signals, wherein each test signal of the multiple test signals is at a same power level, but at a different frequency, than the other test signals of the multiple test signals. Test system controller 208 then optimizes an operating parameter of RF power amplifier 110 by adjusting output matching circuit 116 such that the operating parameter is optimized across each of the multiple test signal frequencies or such that the operating parameter attains a predetermined operating parameter threshold, which threshold is stored in the controller, at each of the multiple test signal frequencies.

Upon determining the multiple preferred operating points, test system 200, preferably test system controller 208, then sets (306) a first preferred operating point of the multiple preferred operating points for RF power amplifier 110, preferably by adjusting output matching circuit 116 of the RF power amplifier. In addition, test system 200, preferably variable voltage power supply 210, couples (308) to RF power amplifier 110 a first supply voltage of a second set of supply voltages. The second set of supply voltages may be the same as the first set of supply voltages. However, those who are of ordinary skill in the art realize that the second set of supply voltages may differ the first set of supply voltages without departing from the spirit and scope of the present invention. In addition, test system 200, preferably signal generator 202, couples (310) at least one test signal to input 109 of RF power amplifier 110, which at least one test signal may or may not be the same as the at least one test signal utilized to determine the multiple preferred operating points.

Based on the coupled supply voltage of the second set of supply voltages, RF power amplifier 110 amplifies (312) the at least one test signal to produce at least one amplified signal. Test system 200, preferably measurement device 204 in conjunction with controller 208, then measures (314) an operating parameter of RF power amplifier 110 based on the at least one amplified signal. For example, test system 200 may measure an output power of the at least one amplified signal, a gain or a phase shift of the at least one amplified signal relative to the corresponding test signal, or a distortion, such as IM, introduced to the at least one amplified signal by RF power amplifier 110. Test system 200, preferably controller 208, then determines (316) a relationship between the at least one test signal, preferably a power associated with the at least one test signal, and the corresponding operating parameter measurements, and stores (318) information related to the determined relationship, such as data points or an algorithm describing a curve that defines the relationship.

Test system 200, preferably controller 208, then determines (320) whether each supply voltage of the second set of supply voltages has been coupled to RF power amplifier 110. When test system 200 determines that at least one supply voltage of the second set of supply voltages has not yet been coupled to RF power amplifier 110, test system 200, preferably variable voltage power supply 210, couples (322) one of the remaining, not yet coupled, supply voltages included in the second set of supply voltages to RF power amplifier 110 and repeats steps (310)–(320).

When test system 200 determines that each supply voltage of the second set of supply voltages has been coupled to RF power amplifier 110, test system 200, preferably test system controller 208, determines (324) an acceptable range of operation with respect to the set operating point. The determination of the acceptable range of operation is based on the relationship determined between the at least one test signal and the corresponding operating parameter measurements for each supply voltage of the second set of supply voltages. The acceptable range of operation describes the range of supply voltages over which RF power amplifier 110 is able to attain an acceptable operating parameter level.

Figure 4:
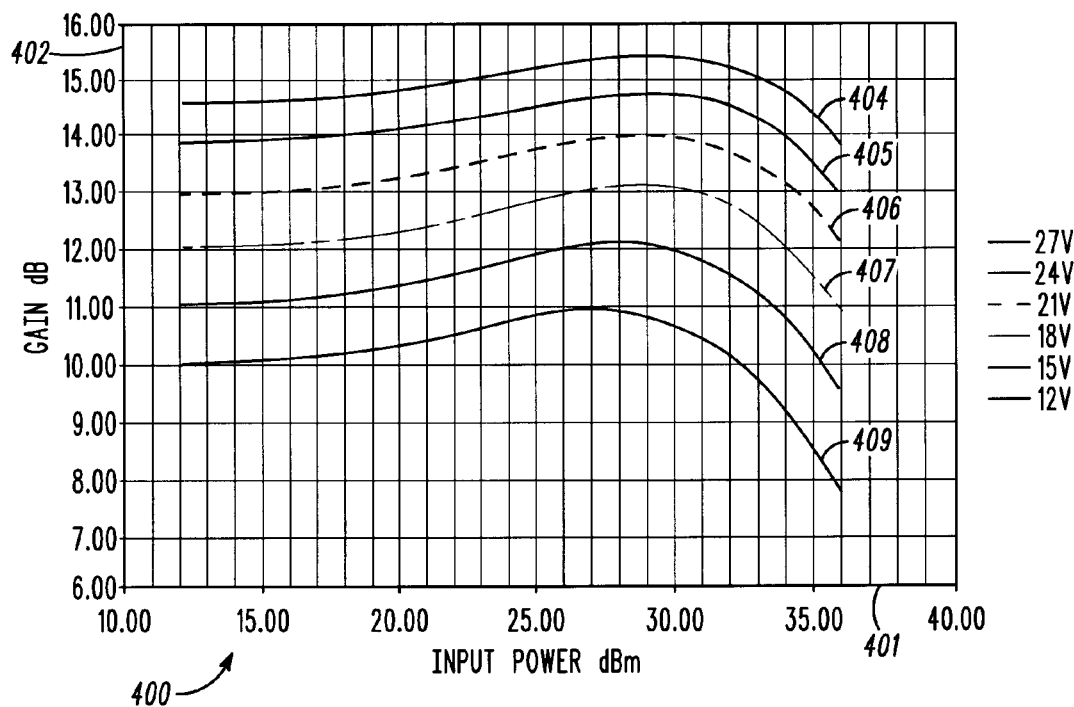
FIG. 4 is an exemplary, graphical representation of a relationship between an input signal and an operating parameter for each supply voltage of multiple supply voltages coupled to an envelope tracking amplification system that has been tuned at a first supply voltage in accordance with an embodiment of the present invention.
Figure 5:
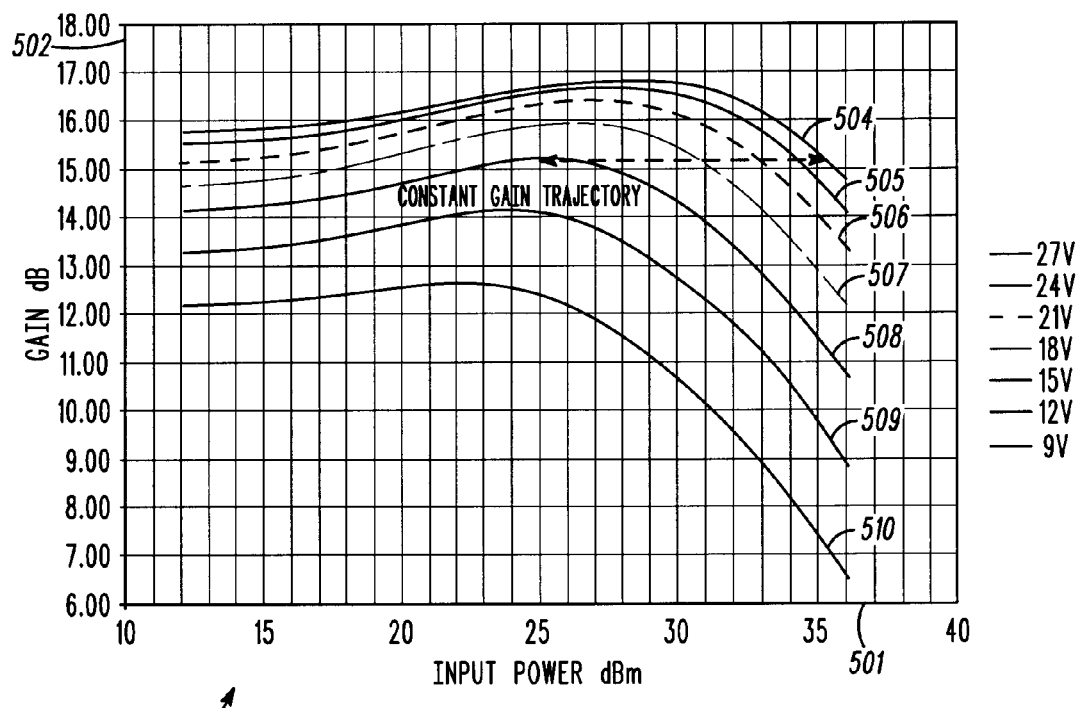
FIG. 5 is an exemplary, graphical representation of a relationship between an input signal and an operating parameter for each supply voltage of multiple supply voltages coupled to an envelope tracking amplification system that has been tuned at a second supply voltage in accordance with an embodiment of the present invention.

For example, FIGS. 4 and 5 depict an acceptable range of operation, that is, a range of supply voltages capable of providing a constant gain, for each of two different operating points of an RF power amplifier such as RF power amplifier 110. The RF power amplifier underlying each of FIGS. 4 and 5 includes an MRF187 power transistor, available from Motorola, Inc., of Schaumburg, Ill., as the RF amplifying element included in the RF power amplifier. MRF187 is a 27 volt (V) part, that is, is rated for a maximum supply voltage of 27V. FIG. 4 graphs data produced by the RF power amplifier when tuned to a preferred operating point at the rated supply voltage of the RF amplifying element, that is, at 27V. FIG. 5 graphs data produced by the RF power amplifier when tuned to a preferred operating point at a lower supply voltage, that is, at 17V.

FIG. 4 is a graphical representation 400 of a relationship between input signal power and gain for the RF power amplifier when tuned to a preferred operating point at 27V. A horizontal axis 401 of graph 400 depicts a power level (in dBm) of an input signal applied to the RF power amplifier, and a vertical axis 402 depicts a power gain (in decibels, or dB) of a signal output by the RF power amplifier in response to the application of the input signal. FIG. 4 further depicts multiple curves 404–409, wherein each curve 404–409 graphs a relationship between an input signal, that is, a power of the input signal, and an operating parameter, that is, a gain of the amplification system, for one of multiple supply voltages (six shown). As depicted in FIG. 4, the curves 404–409 respectively correspond to coupled supply voltages of 27 volts (V), 24V, 21V, 18V, 15V, and 12V.

As can be seen by FIG. 4, the variation in gain among the multiple supply voltage curves 404–409 is sufficiently dramatic that the RF power amplifier can maintain a constant gain (i.e., a constant gain trajectory) across only a very limited range of supply voltages. That is, the RF power amplifier depicted in FIG. 4 is able to achieve a constant gain, of approximately 14 dB, only for supply voltages from 21V to 27V. For supply voltages of less than 21V, the RF power amplifier is unable to attain a gain of approximately 14 dB regardless of the input power level, while for a supply voltage of 27V the RF power amplifier is unable to reduce its gain much below 14 dB regardless of the input power level. Thus an acceptable range of operation for the RF power amplifier tuned at 27V is a supply voltage range of 21V to 27V.

FIG. 5 is a graphical representation 500 of a relationship between input signal power and gain for the RF power amplifier when tuned to a preferred operating point at 17V. Similar to FIG. 4, a horizontal axis 501 of graph 500 depicts a power level (in dBm) of an input signal applied to the RF power amplifier, and a vertical axis 502 depicts a power gain (in dB) of a signal output by the RF power amplifier in response to the application of the input signal. FIG. 5 further depicts multiple curves 504–510, wherein each curve 504–510 graphs a relationship between an input signal, that is, a power of the input signal, and an operating parameter, that is, a gain of the RF power amplifier, for one of multiple supply voltages (seven shown). As depicted in FIG. 5, the curves 504–510 respectively correspond to applied supply voltages of 27 volts (V), 24V, 21V, 18V, 15V, 12V, and 9V.

As shown in FIG. 5, for each supply voltage from 15V to 27V, there exists some input signal power level in the range from approximately 15 dBm to approximately 35 dBm for which the RF power amplifier is able to achieve a gain of approximately 15 dB. That is, FIG. 5 depicts an RF power amplifier that is able to maintain a constant gain (i.e., a constant gain trajectory) across supply voltages ranging from 15V to 27V. Thus an acceptable range of operation for the RF power amplifier tuned at 17V is a supply voltage range of 15V to 27V.

Referring again to FIG. 3, when test system 200 determines that each supply voltage of the second set of supply voltages has been coupled to RF power amplifier 110, test system 200, preferably test system controller 208, further determines (326) whether each operating point of the multiple preferred operating points has been set for RF power amplifier 110. When test system 200 determines that at least one operating point of the multiple preferred operating points has not been set for RF power amplifier 110, test system 200, preferably controller 208, sets (328) one of the remaining, not yet set, operating points of the multiple preferred operating points for RF power amplifier 110. Test system 200 then repeats steps (308)–(326).

When test system 200, preferably test system controller 208, determines that each operating points of the multiple preferred operating points has been set for RF power amplifier 110, test system 200, preferably test system controller 208, compares (330) the acceptable range of operation determined for each operating point of the multiple preferred operating points to the acceptable ranges of operation determined for the other operating points of the multiple preferred operating points to produce at least one comparison. Test system 200, preferably test system controller 208, then determines (332) an optimal operating point based on the at least one comparison. Based on the determined optimal operating point, test system 200, preferably test system controller 208, can determine (334) an optimal supply voltage for a tuning of RF power amplifier 110, which preferably is the supply voltage associated with the optimal operating point. Logic flow 300 then ends (336). The optimal operating point may then be implemented in RF power amplifier 110.

For example, referring again to FIGS. 4 and 5, FIG. 4 depicts an acceptable range of operation, that is, a range of supply voltages over which a constant gain can achieved (i.e., a constant gain trajectory), for an operating point that is set when an RF power amplifier is tuned at a supply voltage of 27V. The acceptable range of operation depicted by FIG. 4 is a supply voltage of 21V to 27V. FIG. 5 depicts an acceptable range of operation, that is, a supply voltage range of 15V to 27V, when the RF power amplifier is tuned at a supply voltage of 17V. A comparison of the acceptable ranges of operation represented by the graphs depicted in each of FIGS. 4 and 5 indicates that the operating point determined when the RF power amplifier is tuned at a supply voltage of 17V provides a wider acceptable range of operation, that is, a wider constant gain trajectory, than the operating point determined when the RF power amplifier is tuned at the rated supply voltage of 27V. Therefore, again referring to FIGS. 4 and 5, an optimal operating point based on the comparison of the acceptable ranges of operation represented therein would be the operating point corresponding to a tuning of the RF power amplifier at a supply voltage of 17V.

In general, tuning system 200 tunes RF power amplifier 110 at each of multiple supply voltages to determine a preferred operating point corresponding to each supply voltage. Tuning system 200 then determines an acceptable range of operation corresponding to each preferred operating point by setting RF power amplifier 110 at the preferred operating point and testing a performance of the RF power amplifier across a range of supply voltages. Tuning system 200 then compares the acceptable ranges of operation determined with respect the preferred operating points and determines an acceptable range of operation, and a corresponding preferred operating point, that yields the optimal performance. As a result, by tuning RF power amplifier 110 supply voltages that are less than a rated supply voltage of RF amplifying element 114, test system 200 is able to determine an optimal operating point with a broader range of acceptable operation than the prior art.

In another embodiment of the present invention, RF power amplifier 110 may be tuned by test system 200 without determining a preferred operating point for each of multiple supply voltages. As depicted in FIGS. 4 and 5, improvements in linearity of an RF power amplifier can be achieved by tuning the RF power amplifier, that is, by determining an optimal operating point based on adjustments of an output match of an RF amplifying element of the RF power amplifier, at a supply voltage that is significantly lower than the rated, or maximum, voltage of the RF amplifying element. Therefore, instead of determining a preferred operating point for each of multiple supply voltages, a tuning voltage that is less than the rated, or maximum, voltage of the RF amplifying element may be predetermined.

Figure 6:
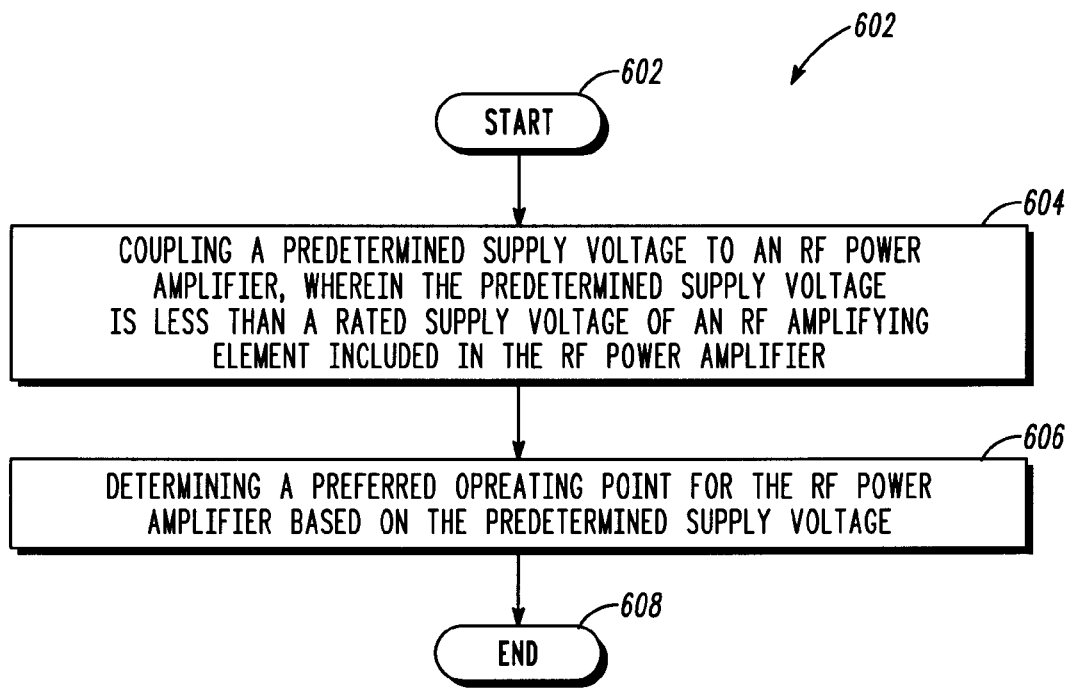
FIG. 6 is a logic flow diagram of steps performed by the test system of FIG. 2 in a tuning of the envelope tracking amplification system of FIG. 1 in accordance with another embodiment of the present invention.

FIG. 6 is a logic flow diagram 600 of a method for tuning RF power amplifier 110 without determining a preferred operating point for each of multiple supply voltages. Logic flow diagram 600 begins (602) when test system 200, preferably variable voltage supply 210, couples (604) a predetermined supply voltage to RF power amplifier 110. The predetermined supply voltage is less than a rated voltage of RF amplifying element 114. Test system 200 then determines (606) a preferred operating point for RF power amplifier 110 based on the predetermined supply voltage, and the logic flow ends (608).

Preferably, the step of determining (604) a preferred operating point includes the following steps. Test system 200, preferably signal generator 202, couples at least one test signal to RF power amplifier 110. Test system controller 208 adjusts output matching circuit 116 in order to adjust an output impedance presented to RF amplifying element 114 and thereby an operating point of the RF amplifying element 114. RF amplifying element 114 amplifies the at least one test signal based on the adjusted operating point to produce at least one amplified signal. Measurement device 204 measures an operating parameter, such as gain, phase, or IM, of RF power amplifier 110 based on the at least one amplified signal and the adjusted operating point. Test system controller 208 then determines a preferred operating point associated with the predetermined supply voltage by selecting an operating point. corresponding to an optimal measured operating parameter.

Preferably, when the RF amplifying element of the RF power amplifier, such as RF amplifying element 114 of RF power amplifier 110, is biased class B, the optimal tuning supply voltage has the same relationship to the rated, or maximum, voltage of the RF amplifying element as the average power of amplified signals produced by the RF power amplifier 110 has to the maximum linear output power, that is, to a power level corresponding to a 1 dB gain compression point. For example, if the average power output by the RF power amplifier during a course of normal operation is 7 dB backed off from a power level corresponding to a 1 dB gain compression point, the supply voltage used to tune up the RF power amplifier is approximately $V_{rated}/\mathrm{Sqrt}(5)$, that is, the rated voltage divided by the square root of 5. In the case of an RF amplifying element with a rated voltage of 26V, the supply voltage used to tune the RF power amplifier for class B operation would be approximately 11–12V. Similarly, an optimal tuning supply voltage for class AB operation is also less than the rated voltage of the RF amplifying element, as shown in FIGS. 4 and 5, although likely a higher percentage of the rated voltage of the RF amplifying element than the class B tuning voltage due to the more linear bias and other considerations as non-linear junction capacitances, non-linear transconductance $g_m$, non-zero saturated voltages, and so on. Optimal tuning supply voltages for other classes of operation can be determined and set by the designer of the RF power amplifier.

In sum, by tuning RF power amplifier 110 at at least one supply voltage that is less than a rated supply voltage of RF amplifying element 114, test system 200 is able to determine an optimal operating point with a broader range of acceptable operation than the prior art. The implementation of the optimal operating point in envelope tracking amplification system 100 produces an amplification system of improved linearity over the amplification systems of the prior art.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for tuning an envelope tracking amplification system having a radio frequency (RF) power amplifier, the method comprising steps of:

determining a preferred operating point for the RF power amplifier for each supply voltage of a first set of supply voltages to produce a plurality of preferred operating points;

for each preferred operating point of the plurality of preferred operating points, determining, for each supply voltage of a second set of supply voltages, a relationship between an operating parameter of the RF power amplifier and a signal coupled to an input of the RF power amplifier to produce a plurality of relationships associated with the preferred operating point;

for each preferred operating point of the plurality of preferred operating points, determining a range of acceptable operation of the RF power amplifier based on the plurality of relationships associated with the preferred operating point; and comparing the range of acceptable operation determined with respect to each preferred opting point of the plurality of preferred operating points to the ranges of acceptable operation determined with respect to the other preferred operating points of the plurality of preferred operating points to produce at least one comparison; and determinng an optimal operating point based on the at least one comparison.

2. The method of claim 1, wherein the first set of supply voltages is the same as the second set of supply voltages.

3. The method of claim 1, further comprising a step of determining an optimal supply voltage for a tuning of the radio frequency power amplifier based on the determined optimal operating point.

4. The method of claim 1, wherein the step of determining a preferred operating point for the radio frequency (RF) power amplifier for each supply voltage of a first set of supply voltages comprises steps of:
   coupling each supply voltage of a first set of supply voltages to the RF power amplifier; and
   in response to coupling each supply voltage of the first set of supply voltages to the RF power amplifier, determining a preferred operating point to produce a plurality of preferred operating points.

5. The method of claim 4, wherein the radio frequency (RF) power amplifier comprises a radio frequency amplifying element coupled to an output matching circuit and wherein the step of determining a preferred operating point comprises a step of, in response to coupling each supply voltage of the first set of supply voltages to the RF power amplifier, adjusting the output matching circuit to produce a preferred operating point for the RF power amplifier.

6. The method of claim 4, wherein the radio frequency (RF) power amplifier comprises a radio frequency amplifying element coupled to an output matching circuit and wherein the step of determining a preferred operating point comprises steps of:
   coupling at least one test signal to tile RE power amplifier;
   in response to coupling the at least one test signal to the RF power amplifier, adjusting the output matching circuit in order to optimize a designated operating parameter of the RF power amplifier; and
   determining a preferred operating point based on the optimization of the designated operating parameter.

7. The method of clam 6, wherein the at least one test signal comprises a plurality of test signals, wherein each test signal of the plurality of test signals is at a different frequency than the other test signals of the plurality of test signals, and wherein the step of adjusting the output matching circuit in order to optimize a designated operating parameter comprises a step of adjust the output matching circuit in order to optimize a designated operating parameter across each of the plurality of test signal frequencies.

8. The method of claim 6, wherein the at least one test signal comprises a plurality of test signals, wherein each test signal of the plurality of test signals is at a different frequency than the other test signals of the plurality of test signals, and wherein the step of adjusting the output matching circuit in order to optimize a designated operating parameter comprises a step of adjusting the output matching circuit in order to achieve a predetermined operating parameter threshold at each of the plurality of test signal frequencies.

9. The method of claim 4, wherein the step of determining a preferred operating point for each supply voltage of a first set of supply voltages to produce a plurality of preferred operating points comprises steps of:
   for each supply voltage of a first set of supply voltages:
      coupling the supply voltage to the radio frequency (RF) power amplifier;
      coupling at least one test signal to the RF power amplifier;
      amplifying the at least one test signal to produce at least one amplified signal; and
      determining a preferred operating point for the supply voltage based on the at least one amplified signal.

10. The method of claim 9, wherein the operating parameter comprises a distortion introduced to the at least one amplified signal by the radio frequency power amplifier.

11. The method of claim 9, wherein the operating parameter comprises a gain of the radio frequency (RF) power amplifier, and wherein the step of determining a range of acceptable operation of the RF power amplifier for each preferred operating point of the plurality of preferred operating points comprises a step of determining a constant gain trajectory for each preferred operating point of the plurality of preferred operating points.

12. The method of claim 1, wherein the step of deterrminng a relationship between an operating parameter of the radio frequency (RF) power amplifier and a signal coupled to an input of the RF power amplifier for each supply voltage of a second set of supply voltages comprises steps of:
   for each supply voltage of a second set of supply voltages:
      establishing a preferred operating point of the RF power amplifier;
      coupling the supply voltage to the RF power amplifier;
      coupling a plurality of test signals to the RF power amplifier;
      producing a plurality of amplified signals based on the plurality of test signals, wherein each amplified signal of the plurality of amplified signals corresponds to a test signal of the plurality of test signals;
      determining with respect to each test signal and corresponding amplified signal, an operating parameter of the RF power amplifier to produce a plurality of operating parameters; and
      determining a relationship between the plurality of test signals and the plurality of operating parameters.

13. The method of claim 12, wherein the step of determining a relationship between an operating parameter of the radio frequency (RF) power amplifier and a signal coupled to an input of the RF power amplifier for each supply voltage of a second set of supply voltages further comprises a step of, for each supply voltage of the second set of supply voltages, storing the relationship between the plurality of test signals and the plurality of operating parameters.

14. A method for tuning an envelope tracking amplification system having a radio frequency (RF) power amplifier comprising steps of:
   determining an operating point for each supply voltage of a plurality of supply voltages to produce a plurality of operating points;
   setting a first operating point of the plurality of operating points and, in response to setting the first operating point:
      coupling a first supply voltage to the RF power amplifier;
      coupling a first input signal to an input of the RF power amplifier;
      amplifying the first input signal to produce a first amplified signal;
      measuring an operating parameter of the RF power amplifier based on the first amplified signal to produce a first operating parameter measurement;
      coupling a second supply voltage to the RF power amplifier;
      coupling a second input signal to the input of the RF power amplifier;
      amplifying the second input signal to produce a second amplified signal;
      measuring an operating parameter of the RF power amplifier based on the input signal and the second amplified signal to produce a second operating parameter measurement;

setting a second operating point of the plurality of operating points and, in response to setting the second operating point:
  coupling the first supply voltage to the RF power amplifier;
  coupling a third input signal to the input of the RF power amplifier;
  amplifying the third input signal to produce a third amplified signal;
  measuring an operating parameter of the RF power amplifier based on the third amplified signal to produce a third operating parameter measurement;
  coupling the second supply voltage to the RF power amplifier;
  coupling a fourth input signal to an input of the RF power amplifier;
  amplifying the fourth input signal to produce a fourth amplified signal;
  measuring an operating parameter of the RF power amplifier based on the fourth amplified signal to produce a fourth operating parameter measurement; and
determining an optimal operating point based on the first operating parameter measurement, the second operating parameter measurement, the third operating parameter measurement, and the fourth operating parameter measurement.

15. The method of claim 14, further comprising a step of determining an optimal supply voltage for a tuning of the radio frequency power amplifier based on the determined optimal operating point.

16. The method of claim 14, wherein the first operating parameter measurement is based on the first input signal and the first amplified signal, the second operating parameter measurement is based on the second input signal and the second amplified signal, the third operating parameter measurement is based on the third input signal and the third amplified signal, and the fourth operating parameter measurement is based on the fourth input signal and the fourth amplified signal.

17. The method of claim 14, wherein the measured operating parameters each comprises a gain of the radio frequency power amplifier.

18. The method of claim 14, wherein the measured operating parameters each comprises a distortion introduced to a respective amplified signal by the radio frequency power amplifier.

19. The method of claim 14, wherein the measured operating parameters each comprises a phase shift associated with tie radio frequency power amplifier.

* * * * *

UNITED STATES PATENT AND TRADEMARK OFFICE
CERTIFICATE OF CORRECTION

PATENT NO. : 6,725,021 B1
DATED : April 20, 2004
INVENTOR(S) : Anderson et al.

It is certified that error appears in the above-identified patent and that said Letters Patent is hereby corrected as shown below:

Column 13,
Line 36, reads "of clam 6", should read -- of claim 6 --

Signed and Sealed this

Twenty-second Day of June, 2004

JON W. DUDAS
*Acting Director of the United States Patent and Trademark Office*